United States Patent [19]

Hongu et al.

[11] 3,882,410

[45] May 6, 1975

[54] GAIN CONTROL CIRCUIT

[75] Inventors: Masayuki Hongu, Tokyo; Hiromi Kawakami, Yokohama, both of Japan

[73] Assignee: Song Corporation, Tokyo, Japan

[22] Filed: Dec. 13, 1973

[21] Appl. No.: 424,307

[30] Foreign Application Priority Data

Dec. 13, 1972 Japan .............................. 47-124874
Dec. 13, 1972 Japan .............................. 47-124875

[52] U.S. Cl. .................... 330/29; 330/18; 330/133; 330/138

[51] Int. Cl. .............................................. H03g 3/30

[58] Field of Search ....... 330/18, 29, 133, 134, 138, 330/145; 325/319, 413

[56] References Cited

UNITED STATES PATENTS

| | | | |
|---|---|---|---|
| 3,003,115 | 10/1961 | Stull | 330/133 |
| 3,177,439 | 4/1965 | Tulp et al. | 330/29 X |
| 3,274,505 | 9/1966 | Frisch et al. | 330/18 |
| 3,482,167 | 12/1969 | Kaplan et al. | 330/29 UX |
| 3,551,834 | 12/1970 | Yamazaki et al. | 330/29 |
| 3,723,895 | 3/1973 | Peil | 330/29 |

*Primary Examiner*—James B. Mullins
*Attorney, Agent, or Firm*—Lewis H. Eslinger; Alvin Sinderbrand

[57] ABSTRACT

A gain control circuit in which a signal current source that has a constant average value and is modulated by the signal to be controlled is connected in the emitter circuit of a gain control transmitter the equivalent AC base-collector impedance of which is controlled by a control voltage applied to the base electrode. A controlled fraction of the signal current flows through a load impedance in series with the collector output circuit of the gain control transistor.

11 Claims, 8 Drawing Figures

FIG.5
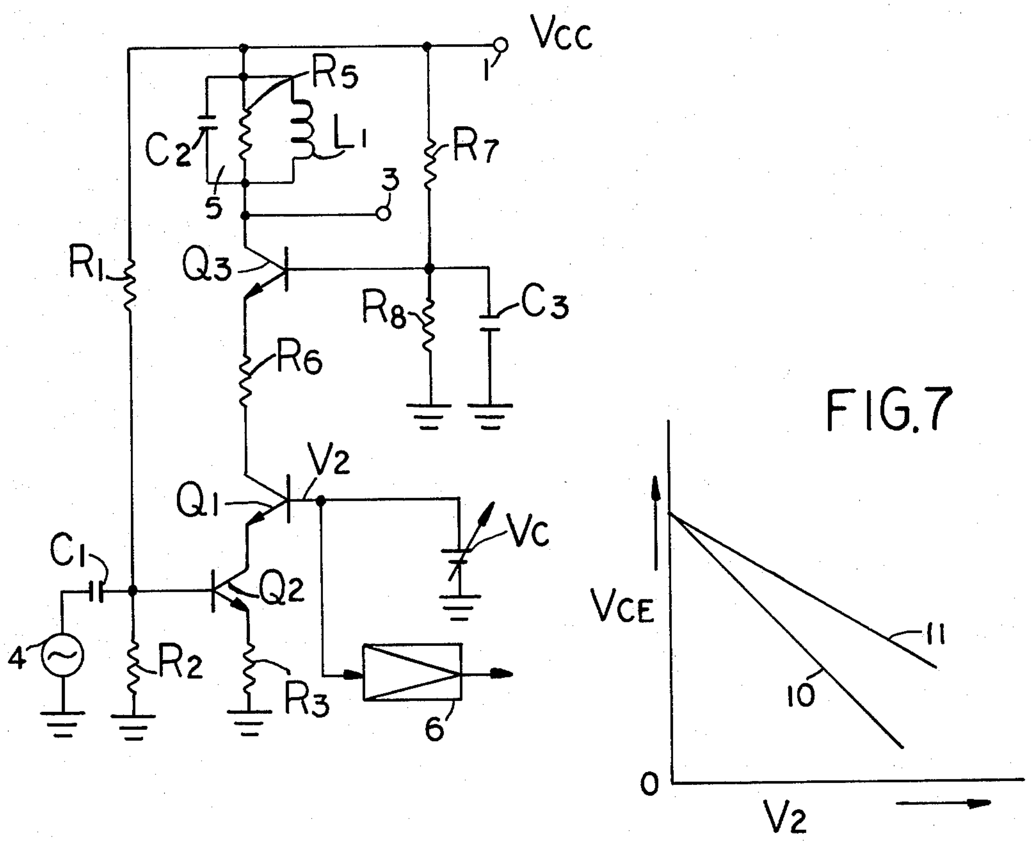
FIG.5, FIG.7
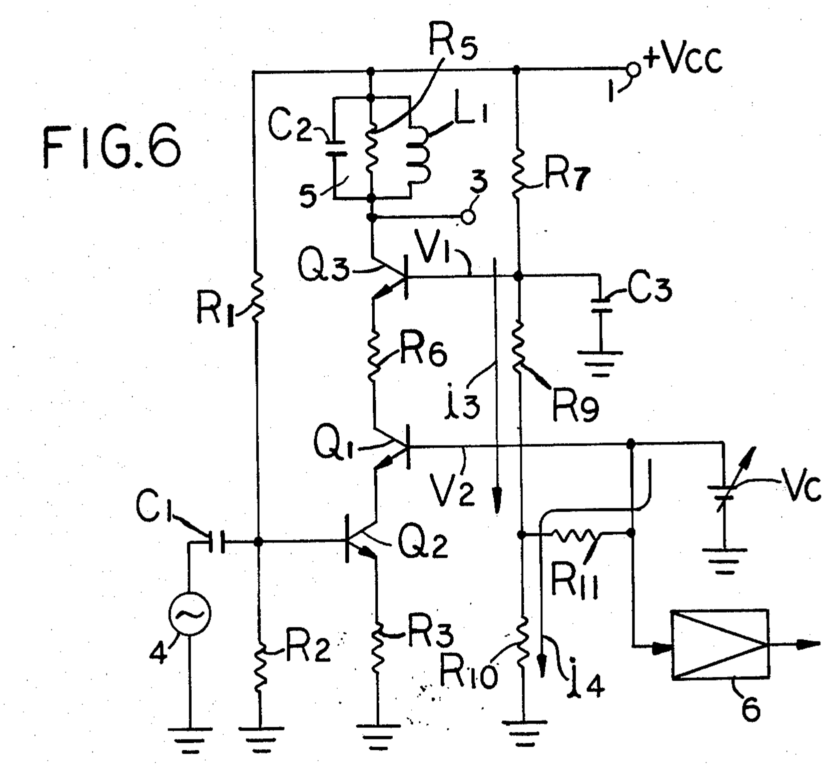
FIG.6

GAIN CONTROL CIRCUIT

BACKGROUND OF THE INVENTION

1. Field of the Invention

This invention relates to the field of gain control circuits and particularly to gain control circuits for high frequency signals and to delayed automatic gain control circuits in multi-stage amplifiers.

2. The Prior Art

Gain control circuits have been widely used in electronic circuits, and although there are many gain control circuit configurations, the desired characteristics have not been completely fulfilled. It is desirable that the circuit configuration be simple and that it be easy to select the correct values for the components and easy to determine the maximum attentuation possible with the chosen circuit. In addition, it is desirable that the input and output impedances and the direct voltage level at the output terminal remain constant when the gain of the circuit is varied.

Some of these characteristics are not compatible with each other. It has been difficult in the prior art to obtain, in a single circuit, many of these desired features, especially when the signal to be controlled had a high frequency. Another difficulty has been obtaining a gain control circuit to control a plurality of amplifiers at one time, as is frequently necessary when several stages are to be controlled by applying an automatic gain control (AGC) signal to them in parallel.

It is an object of the present invention to provide a gain control circuit that includes, simultaneously, a large number of the aforementioned desired characteristics.

Another object is to provide this improved gain control circuit in a configuration suitable for controlling high frequency signals.

A further object is to provide a gain control circuit that can be included in several stages, all of which can then be controlled by a single AGC signal source.

SUMMARY OF THE INVENTION

In accordance with the present invention, a gain control transistor has a signal current circuit connected to its emitter and in series with its emitter-base input circuit. The signal current circuit has a sufficiently high effective output impedance so that the quiescent current through it is substantially constant, although the actual, instantaneous value varies in accordance with the signal. The circuit is a grounded-base circuit so that the base of the control transistor is effectively grounded for signal frequencies although the biasing voltage, which may be obtained from an AVC rectifier circuit, is normally different from zero and is varied to control the base-collector impedance and, thus, the gain of the transistor. A load impedance is connected in series with the collector of the transistor so that a controlled amount of the signal current flows through the load impedance.

The constant current source is normally the emitter-collector circuit of a transistor that operates as a grounded-emitter circuit. The magnitude of current is controlled by a signal voltage applied to the suitably biased base-emitter input circuit.

The emitter of a third transistor may be connected to the collector of the gain control transistor, and the collector of the third transistor connected to the load impedance. This transistor is connected in a grounded base amplifier circuit so that the output impedance of the overall circuit will be held constant, even when the bias on the gain control transistor is changed to change the gain of the circuit. The base of the third transistor may be held at a suitable fixed bias level. Alternatively, it may be connected to the source that biases the base of the gain control amplifier, to control the sensitivity of the gain control circuit with reference to the variable direct voltage of the gain control signals.

The invention may also be embodied in a delayed AGC circuit for a multi-stage amplifier. In that embodiment a separate gain control circuit is included in each of the cascade-connected stages, but all of the control circuits are connected to a common AGC signal source. AGC delay action is obtained by selecting the respective direct bias voltages to have different values at the collector electrodes of the gain controlled transistors.

BRIEF DESCRIPTION OF THE DRAWINGS

FIGS. 4–6 are circuit diagrams of different embodiments of the invention.

FIG. 7 is a graph illustrating the difference in operation between the circuits in FIGS. 5 and 6.

DESCRIPTION OF THE PREFERRED EMBODIMENTS

Figure 1:
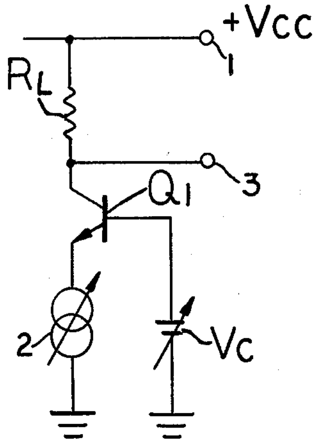
FIG. 1 is a schematic circuit diagram showing a basic gain control circuit according to the present invention.

In the fundamental circuit diagram shown in FIG. 1 a transistor $Q_1$ is connected in a grounded-base circuit. A signal current source 2 is connected between the emitter of the transistor $Q_1$ and ground, and the base of the transistor $Q_1$ is connected to ground through a voltage source $V_C$, which is the voltage that controls the gain of the transistor. The collector of the transistor is connected through a load impedance $R_L$ to the power supply terminal 1. An output terminal 3 is connected to the common circuit point between the collector of the transistor $Q_1$ and the load impedance $R_L$.

The source 2 supplies a current that has a constant average value but varies about this average value in accordance with the signal to be controlled. Thus, it is convenient to refer to the source 2 as a constant signal current source, but with the understanding that this does not mean that the current has a fixed value.

The bias voltage source $V_C$ as illustrated as being variable, and it is to be understood that this includes not only the possibility that the voltage may be a direct voltage capable of being set at different values within some predetermined range but may also be the output of an AGC circuit which varies at a relatively slow rate compared to the frequencies in the signal current from the source 2. Thus, the voltage $V_C$ may be considered to be a direct voltage but not necessarily fixed at a single value.

The operation of the circuit in FIG. 1 will be explained in conjunction with the equivalent circuit shown in FIG. 2. The same reference numerals applicable to elements of FIG. 1 are also used in FIG. 2 to simplify the explanation. In addition, in FIG. 2 the reference character $Z_b$ designates an equivalent base impedance of the transistor $Q_1$, the reference character $Z_e$ designates an equivalent emitter impedance of the transistor $Q_1$, and the reference character $Z_{bc}$ is the equivalent impedance between the base and collector electrodes of the transistor. The current $i_1$ is the signal current from the source 2. The term $\alpha$ is the current amplification factor of the transistor $Q_1$, and the current $i_2$ is the current through the load impedance $R_L$.

As indicated by the arrows, the net current flowing through the impedance $Z_b$ is $i_1$-$i_2$ and the signal voltage drop across $Z_b$, which is $(i_1-i_2)Z_b$, is equal to the sum the voltage drop $i_2R_L$ across the load impedance $R_L$ due to the current $i_2$ plus the voltage drop $(i_2-\alpha i_1)Z_{bc}$ across the impedance $Z_{bc}$ due to the net current flow through the latter impedance. Combining all of these factors and separating out the currents $i_1$ and $i_2$ results in the following equation:

$$i_2 = Z_b + \alpha\, Z_{bc}/Z_b + Z_{bc} + R_L\; i_1 \qquad 1.$$

From equation (1) it can be seen that the ratio between the input and output signal currents $i_1$ and $i_2$, which is the current gain of the circuit, is a function of $Z_b$, $Z_{bc}$, $R_L$, and $\alpha$ and can be controlled by controlling any of them. According to the present invention, the current gain of the circuit is controlled by controlling the equivalent impedance $Z_{bc}$ between the base and collector electrodes of the transistor $Q_1$, while the other factors $Z_b$, $R_L$, and $\alpha$ are maintained constant. The impedance $Z_{bc}$ is controlled by changing the direct voltage $V_C$ at the base electrode of the transistor $Q_1$.

It is known that the impedance $Z_{bc}$ can be controlled by the biasing voltage applied to the PN junction between the base and collector of the electrodes of the transistor $Q_1$. The impedance value of $Z_{bc}$ is very large when the PN junction is reversed-biased and becomes smaller and smaller as the PN junction is biased to the forward direction. It is also known that the impedance value of $Z_{bc}$ varies with frequency so that there is a certain range of the control signal $V_C$ when the impedance value of $Z_{bc}$ becomes smaller for higher frequencies than for lower frequencies.

The present invention takes advantage of the frequency characteristic of the impedance $Z_{bc}$ in order to provide a gain control circuit suitable for high frequency signals. When the voltage $V_{bc}$ between the base and collector electrodes of the transistor $Q_1$ has the polarity and magnitude to reverse-bias the PN junction between the base and collector deeply, the impedance $Z_{bc}$ reaches a high value in the order of several megohms for the signal frequency and is much larger than the impedance $Z_b$ or the impedance of the load $R_L$. In that case, equation (1) may be simplified by neglecting the terms $Z_b$ and $R_L$, leaving:

$$i_2 \approx \alpha\, Z_{bc}/Z_{bc}\; i_1 = \alpha\; i_1 \qquad 2.$$

When the direct voltage $V_{bc}$ between the base and collector electrodes of the transistor $Q_1$ forward-biases the PN junction between these electrodes, the impedance $Z_{bc}$ becomes smaller, and when the forward bias becomes large enough, the impedance $Z_{bc}$ becomes negligible relative to the impedance $Z_b$ and the load impedance $R_L$. In that case, the factors involving the impedance $Z_{bc}$ in equation (1) may be neglected, reducing equation (1) to the following approximate form:

$$i_2 \approx Z_b/Z_b + R_L\; i_1 \qquad 3.$$

In equation (3) the impedance value of the load $R_L$ is usually much larger than that of the equivalent base impedance of the transistor $Q_1$, and equation (3) can therefore be simplified further to the following form:

$$i_2 \approx Z_b/R_L\; i_1 \qquad 4.$$

It should be noted that equations (3) and (4) are satisfied only for higher frequencies and not for lower frequencies when the control voltage $V_C$ has a relatively small value for forward biasing the PN junction between the base and collector electrodes. On the other hand, equations (3) and (4) are satisfied for both higher and lower frequencies when the control voltage strongly forward-biases the PN junction, because in that case the impedance $Z_{bc}$, which varies with frequency, is negligibly small.

According to one example of this invention, the range of the control voltage $V_C$ is selected such that the impedance $Z_{bc}$ is controlled only for signal frequencies and not for direct voltage or for the low frequencies that may be included in the control voltage $V_C$. Thus, the direct voltage of the output terminal 3 is maintained constant, while the current gain of the signals through the transistor $Q_1$ is controlled from the value $\alpha$ to the value $Z_b/R_L$, as shown in equations (1) and (4), respectively. The equivalent base impedance $Z_b$ usually has a very small value relative to the load impedance $R_L$, as mentioned above, and so the current gain $Z_b/R_L$ expressed by equation (4) is very small, much lower than unity. However, it is possible to increase impedance $Z_b$ and the current gain by inserting an impedance, such as a resistor, in the base circuit of the transistor $Q_1$. This simplifies the design of the circuit to obtain a given minimum gain or maximum attenuation of the signal.

Figure 2:
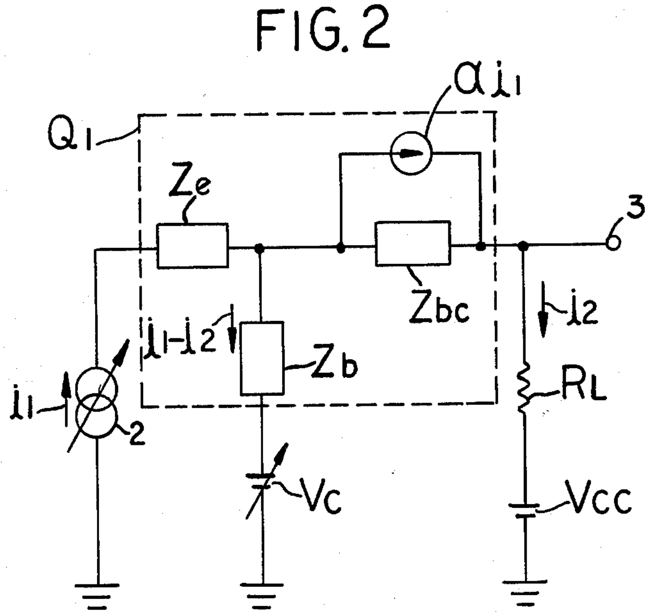
FIG. 2 is an equivalent circuit of the circuit shown in FIG. 1.
Figure 3:
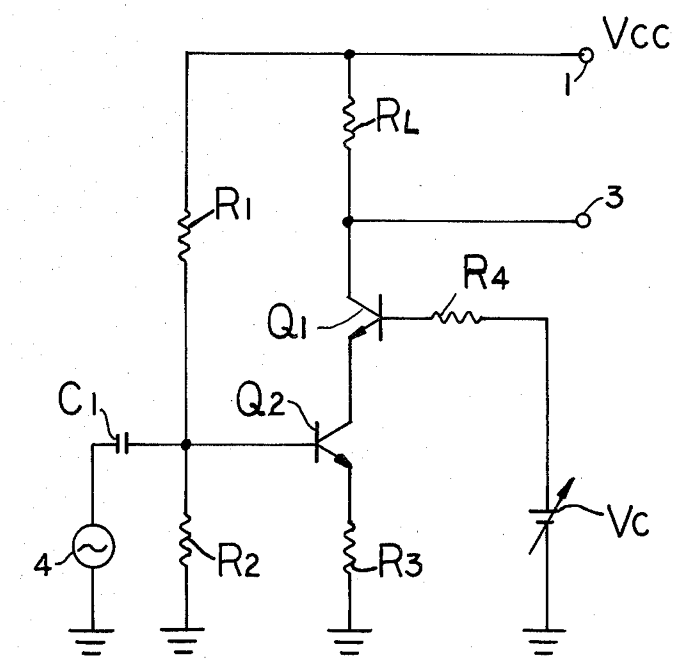
FIG. 3 is a schematic circuit diagram of a practical embodiment of the gain control circuit of the present invention.

FIG. 3 shows a practical circuit according to the present invention and uses the same components and reference characters as the circuits in FIGS. 1 and 2. The components so identified need not be described again. The current source 2 of FIGS. 1 and 2 has been replaced in FIG. 3 by a transistor $Q_2$. This transistor may be referred to as the constant current transistor, and it is connected in a grounded emitter circuit. One terminal of a signal voltage source 4 is connected by way of a coupling capacitor $C_1$ the base of the transistor $Q_2$. The other terminal of the voltage source 4 is connected to ground. Two series-connected resistors $R_1$ and $R_2$ form a voltage divider across the power supply between the terminal 1, which has the voltage $V_{CC}$, and ground. The base of the transistor $Q_2$ is connected to the common circuit point between the resistors $R_1$ and $R_2$, and the bias of the base-emitter circuit of the transistor $Q_2$ is determined by the voltage at this common circuit point in combination with the voltage across a resistor $R_3$ that connects the emitter of the transistor $Q_2$ to ground. A resistor $R_4$ is connected between the control voltage source $V_C$ and the base of the gain control transistor $Q_1$ and may be referred to as a base resistor.

In the operation of the circuit in FIG. 3, a signal voltage applied to the base electrode of the transistor $Q_2$ from the signal voltage source 4 is converted to a signal current by the transistor $Q_2$ and is applied to the emitter electrode of the transistor $Q_1$ in accordance with the fact that the transistor $Q_2$ serves as the constant signal current signal transistor. The base resistor $R_4$ serves as one of the impedance elements that determine the maximum attenuation, or minimum gain, of the circuit according to equations (3) or (4).

The equivalent circuit of the schematic shown in FIG. 3 is almost the same as the equivalent circuit shown in FIG. 2, and it is therefore unnecessary to repeat the analysis of control operation.

The circuits shown in FIGS. 1 and 3 have a number of characteristics that are desirable in gain control circuits. In each instance, the circuit configuration is simple. Furthermore, the input impedance is maintained constant when the gain is being varied in accordance with the gain control operation. This is because the signal input transistor $Q_2$ is operated in its active region as a constant current source. In addition, the attenuation of the circuit is easily calculated by selecting the resistance values of the load impedance $R_L$ and the base resistor $R_4$. Another advantage is that the direct voltage level of the output terminal 3 can be maintained constant when the gain control operation is being performed in a selected range of the gain control signal voltage $V_C$.

Figure 4:
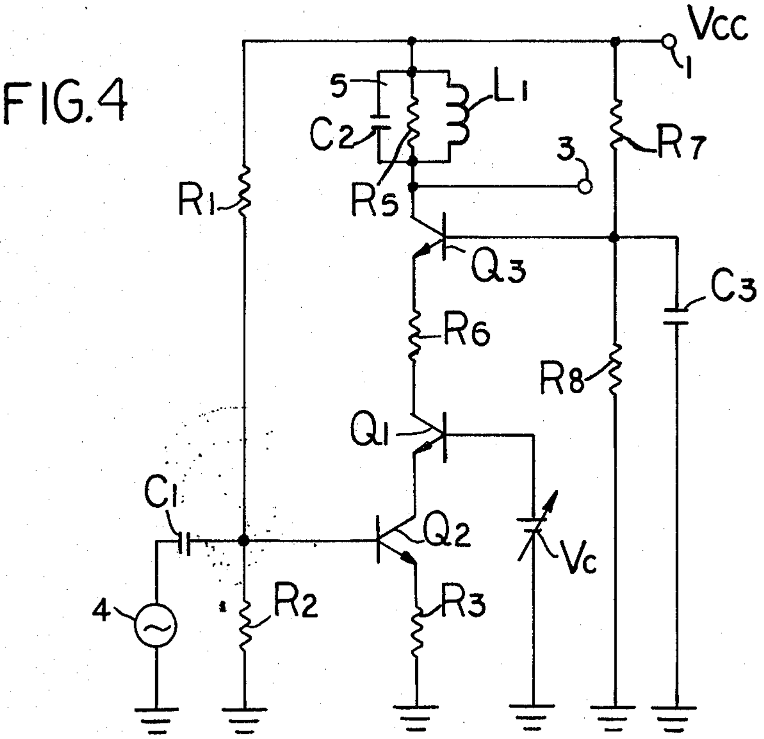

Another practical embodiment of the invention is shown in the circuit in FIG. 4, which also uses a number of the same components as the previous circuits and identifies these components by the same reference characters. In FIG. 4 a tuned circuit 5, which is a parallel-tuned tank circuit, is used as the load impedance $R_L$ instead of the resistor indicated in FIGS. 1 and 3. The load impedance 5 includes a capacitor $C_2$ and an inductor $L_1$ connected in parallel. A resistor $R_5$ is also connected in parallel with the capacitor $C_2$ and the inductor $L_1$ to control the Q factor of the tuned load impedance 5.

The load impedance is not connected directly to the collector of the gain control transistor $Q_1$ but instead is connected to the collector of an amplifier transistor $Q_3$ which is connected in a grounded base circuit. A resistor $R_6$ connects the collector of the gain control transistor $Q_1$ to the emitter of the amplifier transistor $Q_3$. The output terminal 3 is connected to a common circuit point between the tuned load impedance 5 and the collector of the transistor $Q_3$, and the bias voltage for this transistor is obtained by means of a voltage divider comprising two resistors $R_7$ and $R_8$ connected across the power supply voltage $V_{CC}$ between the terminal 1 and ground. The base of the transistor $Q_3$ is connected to the common circuit point between these two resistors, and a capacitor $C_3$ is connected across the resistor $R_8$ to ground the base of the transistor $Q_3$ for signal frequencies.

Basically, the operation of the circuit in FIG. 4 is almost the same as the operation of the circuits in FIGS. 1 and 3. The additional factor is the grounded base transistor $Q_3$. The reason that the grounded base transistor $Q_3$ is added between the transistor $Q_1$ and the tuned load impedance 5 is because the equivalent impedance seen from the load impedance 5 looking toward the transistor $Q_1$ can be maintained high and almost constant when the value of the gain control signal $V_C$ changes. Thus, the Q factor of the tuned load impedance 5 is not influenced but is maintained constant when the value of the gain control signal $V_C$ changes. If the transistor $Q_3$ were not connected in the circuit, the tuned load impedance 5 would be connected directly to the collector electrode of the gain control transistor $Q_1$. In that case, the equivalent impedance seen from the tuned load impedance 5 looking toward the transistor $Q_1$ would be influenced or changed when the value of the gain control signal $V_C$ changed. This is because the equivalent impedance $Z_{bc}$ between the base and collector electrodes of the transistor $Q_1$ is controlled, or changed, in accordance with the gain control signal $V_C$. Thus, the Q factor of the tuned load impedance 5 would be influenced or deteriorated by the gain control signal $V_C$.

It is possible to omit the resistor $R_6$ between the collector electrode of the gain control transistor $Q_1$ and the emitter electrode of the amplifier transistor $Q_3$, but the purpose of this resistor is to eliminate or decrease noise signals generated by the transistor $Q_3$, especially when the equivalent impedance $Z_{bc}$ of the base and collector electrodes of the transistor $Q_1$ is caused to be small due to the gain control signal $V_C$. The resistor $R_6$ keeps the equivalent emitter impedance of the transistor $Q_3$ relatively high, regardless of the equivalent impedance $Z_{bc}$ of the transistor $Q_1$. As a result, the gain of the transistor $Q_3$ with respect to noise signals is made small and consequently the replica of the noise signals in the collector circuit of the transistor $Q_3$ or in the tuned load impedance is small.

FIGS. 5 and 6 also include a number of circuit components similar to those in the circuit of FIG. 4. FIG. 5 includes, in addition to the components of FIG. 4, another amplifier system 6 controlled by the same control signal voltage $V_C$ as the amplifier system comprising the transistors $Q_1$-$Q_3$ in FIG. 4.

In FIG. 6, instead of a single resistor connected between the base of the transistor $Q_3$ and ground, there are two series connected resistors $R_9$ and $R_{10}$. Another resistor $R_{11}$ is connected between the base of the gain control transistor $Q_1$ and the common circuit point between the resistors $R_9$ and $R_{10}$.

In FIGS. 5 and 6 the reference character $V_2$ designates the base voltage of the transistor $Q_1$, and the voltage characteristics of the collector-emitter voltage $V_{CE}$ of the transistor $Q_1$ relative to the base voltage $V_2$ are shown in FIG. 7. The straight line 10, represents the relationship between the voltage $V_{CE}$ and the voltage $V_2$ in FIG. 5 and the straight line 11 illustrates the relationship between the voltage $V_{CE}$ and the voltage $V_2$ in FIG. 6.

In FIG. 5 the gain control signal $V_C$ is applied to the base of the gain control transistor $Q_1$ and the sensitivity S of the gain control operation is expressed as follows:

$$S = 2A/2V_2 = 2A/2V_{CE} \cdot 2V_{CE}/2V_2 \qquad 5.$$

where:

A is the gain of the circuit;

$V_2$ is the base voltage of transistor $Q_1$, and $V_{CE}$ is the collector-emitter voltage of transistor $Q_1$ In equation (5) $2A/2V_{CE}$ has a constant value determined by the transistor $Q_1$ so that equation (5) becomes:

$$S = K \cdot 2V_{CE}/2V_2 \quad (6)$$

where:

K is a constant and is equal to $2A/2V_{CE}$

From equation (6) it is to be understood that the sensitivity of the gain control operation of the circuit, which is expressed by the ratio of the increment of A to the increment of $V_{CE}$ is determined by the ratio of the increment of $V_{CE}$ to the increment of $V_2$, where the base voltage $V_2$ is equal to the gain control voltage $V_{CE}$.

In the circuit of FIG. 5, the direct voltage at the collector electrode of the gain control transistor $Q_1$, which is the reference voltage, is maintained constant relative to the base voltage when the direct voltage at the base electrode varied. Thus, the voltage characteristic of the voltage $V_{CE}$ between the collector and emitter electrodes of the gain control transistor $Q_1$ relative to the base voltage $V_2$ of the same transistor can be drawn as a straight line 10 in FIG. 7 because the direct voltage at the emitter electrode changes linearly with respect to the direct voltage at the base of the electrode when the direct voltage at the collector electrode is maintained constant.

The sensitivity S of the gain control operation of the circuit in FIG. 5, which is determined according to equation (6), becomes relatively high compared to the sensitivity of the gain control operation of FIG. 6. When the sensitivity S of the gain control operation is high, the range of the control signal voltage $V_C$ should be restricted to a limited set of values to obtain a desirable range of the gain of the circuit. Such a restriction of the range of the control voltage is often undesirable, especially when the gain of another amplifier system 6 is to be controlled by the same signal $V_C$ in a different range of gain, such as occurs when a delayed AGC operation is performed.

The sensitivity S of the gain control operation of the circuit in FIG. 6 is reduced to make it less necessary to restrict control signal $V_C$. In FIG. 6 the resistors $R_7$, $R_9$, and $R_{10}$ form a voltage divider across the power supply voltage $V_{CC}$ between the terminal 1 and ground. The resistors $R_9$ and $R_{10}$ are essentially substituted for the resistor $R_8$ in the circuit in FIG. 5, and the common circuit point between the resistors $R_9$ and $R_{10}$ is connected to the control voltage $V_C$ by way of a resistor $R_{11}$. Thus, a fraction of the control voltage $V_C$ is connected to the base of the transistor $Q_3$.

In analyzing the operation of the circuit of FIG. 6, It may first be supposed that the gain control voltage $V_C$ is removed and that the base currents of the transistors $Q_1$ and $Q_3$ may be neglected. The following equations are then true:

$$V_1 = R_9 + R_{10} / R_7 + R_9 + R_{10}\ V_{CC} \quad (7)$$

$$V_2 = R_{10}/R_7 + R_9 + R_{10}\ V_{CC} \quad (8)$$

where $V_1$ and $V_2$ are the direct voltages at the base electrodes of the transistors $Q_3$ and $Q_1$, respectively, when the control voltage $V_C$ is removed.

In calculating the values of the circuit components in FIG. 6, the base voltages $V_1$ and $V_2$ of the transistors $Q_3$ and $Q_1$ (when the control voltage $V_C$ is removed) are first selected such that the gain of the circuit is a maximum and the resistance values of the resistors $R_7$, $R_9$ and $R_{10}$ are determined according to equations (7) and (8).

The value of the gain control signal voltage $V_C$ is selected to be larger than the base voltage $V_2$ expressed by equation (8) and applied not only to the base of the transistor $Q_1$ but also to the base of the transistor $Q_3$. Therefore, when the gain control voltage, $V_C$ is applied, the base voltage of the transistor $Q_1$ is increased compared with the voltage $V_2$ and expressed by the equation (8). The base voltage of the transistor $Q_3$ is also increased compared with the voltage $V_1$ and expressed by equation (7). As a result, the collector voltage of the transistor $Q_1$, which is the reference voltage relative to the base voltage of the same transistor is also increased. Accordingly, the sensitivity S of the gain control operation of the circuit is reduced as compared with that of the circuit in FIG. 5 because the collector voltage of the transistor $Q_1$ is changed by the gain control voltage $V_C$ in the same direction as that of the base voltage of the same transistor.

The operation of the circuit in FIG. 6 when the gain control voltage $V_C$ is applied is made more clear by following equations. When the gain control signal $V_C$ is applied, and the base currents of the transistors $Q_1$ and $Q_3$ are neglected, the following equations hold true:

$$V_2 = i_3 R_{10} + i_4 (R_{10} + R_{11}) \quad (9).$$

$$V_1 = V_{CC} - i_3 R_7 \quad (10)$$

$$V_{CC} = i_3 (R_7 + R_9 + R_{10}) + i_4 R_{10} \quad (11)$$

where:

$V_2$ and $V_1$ are the direct voltages at the base electrodes of the transistors $Q_1$ and $Q_3$, respectively;

$i_3$ is a current which flows through the resistors $R_7$ and $R_9$; and $i_4$ is the current that flows through the resistor $R_{11}$.

The current $i_3$ may be determined from equations (9) and (11) to be:

$$i_3 = V_{CC}(R_{10} + R_{11}) - V_2\ R_{10} / (R_7 + R_9) R_{10} + (R_7 + R_9 + R_{10})\ R_{11} \quad (12)$$

If the voltage $V_{be}$ between the base and the emitter electrodes of the transistor $Q_1$ equals that of the transistor $Q_3$ and the voltage drop $V_d$ across the resistor $R_6$ is maintained constant, the voltage $V_{CE}$ between the collector and emitter electrodes of the transistor $Q_1$ is expressed as follows:

$$V_{CE} = V_1 - V_2 - V_d \quad (13)$$

Substituting equations (10) in equation (13) yields $$V_{CE} = (V_{CC} - i_3 R_7) - V_2 - V_d \quad (14)$$

Substituting equations (12) in equation (14) yields $$V_{CE} = V_{CC} - V_{CC}(R_{10}+R_{11}) - V_2\ R_{10}/(R_7+R_9)R_{10} + (R_7+R_9+R_{10})\ R_{11}\ .\ R_7 - V_2 - V_d \qquad 15.$$

The ratio between the increments of the voltage $V_{CE}$ of the transistor $Q_1$ and the gain control signal voltage $V_C$, which is equal to the base voltage $V_2$ of the same transistor, is found by differentiating $V_{CE}$ with respect to $V_2$ in equation (15) as follows:

$$2V_{CE}/2V_C = 2V_{CE}/2V_2 = R_{10}\ R_7/(R_7+R_9)R_{10} + (R_7+R_9+R_{10})\ R_{11} - 1 \qquad 16.$$

In equation (16), when the resistance $R_{11}$ is infinite, the equation reduced to:

$$2V_{CE}/2V_2 = -1 \qquad 17.$$

The resistor $R_{11}$ is not used in the circuit in FIG. 5 and so the equation (17) is satisfied by that circuit. Thus, the sensitivity S of the gain control operation in FIG. 5 is high.

However, the resistance value of the resistor $R_{11}$ is finite in the circuit in FIG. 6 and so equation (17) is not satisfied. As a result, the relationship between the voltages $V_{CE}$ and $V_2$ corresponds to the straight line 11 in FIG. 7, and the change of the voltage $V_{CE}$ relative to a change of the voltage $V_2$ is smaller than in the circuit of FIG. 5. Thus, the sensitivity S of the gain control operation of FIG. 6 is reduced relative to that in FIG. 5.

The resistance values $R_7$, $R_9$, $R_{10}$, and $R_{11}$ may be selected to satisfy the following equation as an example:

$$R_{10}\ R_7/(R_7+R_9)R_{10} + (R_7+R_9+R_{10})\ R_{11} = \tfrac{1}{2} \qquad 18.$$

Substituting (18) in equation (16) yields:

$$2V_{CE}/2V_2 = -\tfrac{1}{2} \qquad 19.$$

From equations (6), and (18) and (19) it can be seen that the sensitivity of the gain control operation of the circuit in FIG. 6 is half the value of that of FIG. 5 when the resistance values $R_7$, $R_9$, $R_{10}$, and $R_{11}$ are selected to satisfy equation (18).

When the sensitivity S of the gain control operation is chosen, the range of the control signal voltage $V_C$ can be increased to permit the gain of another amplifier system 6 to be controlled in a different range of gain, such as may be required for a delayed AGC operation.

Figure 8:
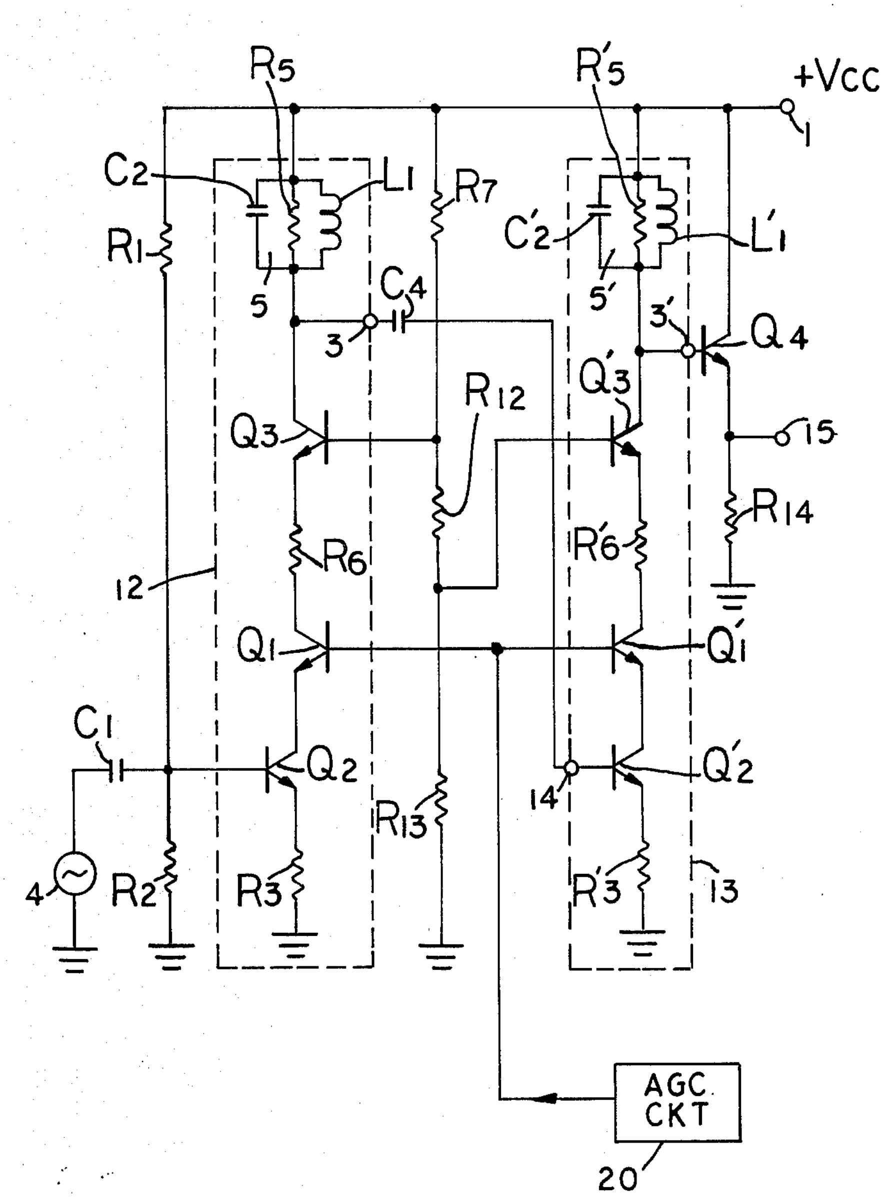
FIG. 8 is a schematic circuit diagram of a multi-stage amplifier incorporating the present invention.

FIG. 8 shows a circuit similar to that in FIG. 6 but with a second set of components to form a multi-stage amplifier. In FIG. 8, the signal voltage source 4 supplies high frequency signals, such as intermediate frequency (i.f.) signals of a television receiver, to the base electrode of the transistor $Q_2$. The circuit configuration includes a pair of gain controlled amplifiers 12 and 13 connected in cascade, each of which is fundamentally similar to the circuit in FIG. 4.

The first amplifier 12 consists of the transistors $Q_1$, $Q_2$, and $Q_3$, and a tuned load impedance, or tank circuit, 5. The other gain control amplifier 13 includes the transistors $Q_1'$, $Q_2'$, and $Q_3'$, and a tank circuit 5'. The output terminal 3 of the first amplifier 12 is connected through a coupling capacitor $C_4$ to an input terminal 14 of the amplifier 13. A voltage divider comprising resistors $R_7$, $R_{12}$, and $R_{13}$ is connected between the power supply terminal 1 and ground. A common circuit point between the resistors $R_7$, $R_{12}$ is connected to the base electrode of the transistor $Q_3$ in the amplifier 12 and a different common circuit point between the resistors $R_{12}$ and $R_{13}$ is connected to the base of the transistor $Q_3'$ in the amplifier 13.

An AGC circuit 20 is connected to the bases of the two gain control transistors $Q_1$ and $Q_1'$ in the amplifiers 12 and 13, respectively. Gain controlled output signals are obtained through the output terminal 3' of the amplifier 13 and are applied to an emitter follower transistor $Q_4$. This transistor has an emitter-load $R_{14}$ and is connected to an output terminal 15, which is the output terminal for the entire circuit.

A point to be specifically noted in the circuit of FIG. 8 is that the voltages at the collector electrodes of the gain controlled transistors $Q_1$ and $Q_1'$, each of which is the reference voltage relative to the gain control signals supplied to the base electrode thereof, are different from each other. A delayed AGC operation is carried out in this way even though the AGC signals from the circuit 20 are applied in common to the base electrodes of both of the gain control transistors $Q_1$ and $Q_1'$. This delayed AGC operation will now be explained in detail.

Due to the fact that the base electrodes of the transistors $Q_3$ and $Q_3'$ are connected to different points along the voltage divider formed by the resistors $R_7$, $R_{12}$, and $R_{13}$, the direct voltages at the base electrodes of the transistors $Q_1$ and $Q_1'$ are made different from each other. If the direct voltage $V_{be}$ between the base and emitter electrodes of the transistor $Q_3$ is equal to that of the transistor $Q_3'$ and if the direct voltage drop across the resistor $R_6$ is equal to that across the resistor $R_6'$, the direct voltage of the collector electrode of the transistor $Q_3$ is different from and higher than that at the collector electrode of the transistor $Q_3'$ by the amount of the direct voltage drop across the resistor $R_{12}$.

Each of the direct voltages at the collectors of the transistors $Q_1$ and $Q_1'$ is a reference voltage relative to the respective gain control signals supplied to the base electrode of these transistors, so that the following characteristics are obtained in the circuit:

1. When the gain control signal from the circuit 20 is in a relatively low range or level, only the amplifier 13 has its gain controlled and the amplifier 12 does not. This is because the collector voltage of the transistor $Q_1'$ is selected to be lower than that of the transistor $Q_1$, and only the voltage between the base and collector electrodes of the transistor $Q_1'$ is in a range to control the equivalent impedance $Z_{bc}$ thereof, as described previously in connection with FIG. 2. The voltage between the base and collector electrodes of the transistor $Q_1$ is not in a range to control the equivalent impedance $Z_{bc}$ of that transistor.

2. When the gain control signal from the circuit 20 is in a higher range, or level, both of the amplifiers 12 and 13 have their gains controlled, because the voltage between the base collector electrodes of the respective transistors $Q_1$ and $Q_1'$ is in a range to control equivalent impedance $Z_{bc}$ of the respective transistors.

3. When the gain control signal from the circuit 20 is still higher, only the amplifier 12 has its gain controlled, because in this range of the gain control signal, the voltage between the base and collector electrodes of the transistor $Q_1'$ has reached a value such that the maximum attenuation, or minimum gain, of the amplifier 13 has been attained, according to equation (4) as discussed in connection with FIG. 2.

4. When the gain control signal from the circuit 20 is in a still higher range, neither of the amplifiers 12 and 13 has its gain controlled, because in this range of the gain control signal, the voltages between the base and collector electrodes of the transistors $Q_1$ and $Q_1'$ are such that the maximum attenuation, or minimum gain, of the amplifiers has been reached according to equation (4).

It is to be understood from the preceding characteristic (1)-(4) that a delayed AGC operation is performed in the circuit of FIG. 8 where the AGC operation for the amplifier 12 of the preceding stage is delayed relative to that for the amplifier 13 of the succeeding stage. It may also be seen that the circuit configuration necessary to obtain the delayed AGC operation is very simple, because only the voltage dividing resistors $R_7$, $R_{12}$, and $R_{13}$ are used, and the AGC signals from the circuit 20 can be applied in common to the bases of the transistors $Q_1$ and $Q_1'$.

What is claimed is:

1. A gain control circuit comprising:

A. a constant signal current source transistor having a base-emitter input circuit and an emitter-collector output circuit, said constant signal current source transistor being biased to operate in its active region; and being supplied with a signal voltage;

B. a gain control transistor having base emitter, and collector electrodes;

C. circuit means to connect said constant current source transistor output circuit in series with said gain control transistor emitter electrode;

D. a load impedance connected to said gain control transistor collector electrode; and E. a gain control voltage source connected to said gain control transistor base electrode for forward-biasing the base-collector junction of said gain control transistor to control the base-collector impedance thereof so as to control the gain of said gain control transistor.

2. The gain control circuit of claim 1 comprising, in addition:

A. an amplifier transistor comprising:
   1. an emitter and a collector connected in series between said collector of said gain control transistor and said load impedance, and
   2. a base electrode; and B. means to bias said base electrode of said amplifier transistor.

3. The gain control circuit of claim 2 comprising a second impedance connected in series between said emitter of said amplifier transistor and said collector of said gain control transistor.

4. The gain control circuit of claim 3 in which said second impedance is a resistor.

5. The gain control circuit of claim 3 in which said load impedance is a parallel-tuned circuit responsive to said signal current.

6. The gain control circuit of claim 2 comprising, in addition:

A. a second constant current transistor having a base-emitter input circuit and an emitter-collector output circuit;

B. a second gain control transistor comprising:
   1. an emitter connected to said emitter-collector output circuit of said second constant current transistor,
   2. a base electrode, and
   3. a collector electrode;

C. a second load impedance;

D. a second amplifier transistor comprising;
   1 an emitter and a collector connected in series between said collector of said second gain control transistor and said second load impedance, and
   2. a base electrode;

E. second biasing means to bias said base electrode of said second amplifier transistor; and F. a signal-transmitting connection from said first-named load impedance to said input circuit of said second constant current transistor.

7. The gain control circuit of claim 6 in which said second bias means biases said second amplifier transistor at a different bias voltage than the bias voltage applied to said first-named amplifier transistor by said means to bias the base electrode of said first-named amplifier.

8. The gain control circuit of claim 7 in which the bias voltage of said first-named amplifier transistor is closer to the collector voltage thereof than the bias voltage of said second amplifier is to the collector thereof.

9. A gain control circuit comprising:

a constant current transistor having a base-emitter input circuit and an emitter-collector output circuit;

means to connect said input circuit to a source of signal voltage;

a gain control transistor having base emitter, and collector electrodes;

circuit means to connect said constant current transistor output circuit in series with said gain control transistor emitter electrode;

a load impedance connected to said gain control transistor collector electrode;

a gain control voltage source connected to said gain control transistor base electrode to control the base-collector impedance of said gain control transistor to control the gain of said gain control transistor;

an amplifier transistor comprising:
   1. an emitter and a collector connected in series between said collector of said gain control transistor and said load impedance, and
   2. a base electrode; a second impedance connected in series between said emitter of said amplifier transistor and said collector of said gain control transistor;

means to bias said base electrode of said amplifier transistor; and means to connect said gain control voltage source to said base of said amplifier transistor.

10. A gain control circuit comprising:

A. an amplifier comprising first and second input terminals;

B. gain control means connected to said first terminal to supply a variable control voltage thereto;

C. reference voltage means connected to said second terminal to supply a reference voltage thereto;

D. means in said amplifier to control the gain of said amplifier in accordance with the voltage difference between the control voltage supplied to said first terminal and the reference voltage supplied to said second terminal; and E. means to connect said gain control means to said reference voltage means for adding a part of said variable control voltage to said reference voltage to reduce the sensitivity in the gain control operation of said amplifier.

11. A gain control circuit comprising:

A. first and second amplifiers connected in series and each comprising:

1. gain control means,

2. a gain control terminal, and

3. a reference voltage terminal;

B. gain control voltage supply means connected in common to both of said gain control terminals to supply the same gain control thereto;

C. a voltage divider circuit coupled to a voltage supply source to derive therefrom first and second different reference voltages, said voltage divider circuit being connected to said reference voltage terminal of said first amplifier to supply said first reference voltage thereto; and said voltage divider circuit being connected to said reference voltage terminal of said second amplifier to supply said second reference voltage thereto, the gain of said first and second amplifiers being controlled, respectively, by the voltage difference between said variable control voltage applied to both of said gain control terminals and the respective reference voltage applied to the respective reference voltage terminal, whereby a delay action of the gain control operation is performed between said first and second amplifiers.

* * * * *

UNITED STATES PATENT OFFICE

CERTIFICATE OF CORRECTION

Patent No. 3,882,410 Dated May 6, 1975

Inventor(s) Masayuki HONGU et al

It is certified that error appears in the above-identified patent and that said Letters Patent are hereby corrected as shown below:

In the heading:

Change

[73] Assignee: Song Corporation, Tokyo, Japan to:

[73] Assignee: Sony Corporation, Tokyo, Japan

Signed and Sealed this

*twentieth* Day of *January 1976*

[SEAL]

*Attest:*

RUTH C. MASON
*Attesting Officer*

C. MARSHALL DANN
*Commissioner of Patents and Trademarks*